US006610354B2

(12) United States Patent
Law et al.

(10) Patent No.: US 6,610,354 B2
(45) Date of Patent: Aug. 26, 2003

(54) PLASMA DISPLAY PANEL WITH A LOW K DIELECTRIC LAYER

(75) Inventors: Kam S. Law, Union City, CA (US); Quanyuan Shang, Saratoga, CA (US); Takako Takehara, Hayward, CA (US); Taekyung Won, San Jose, CA (US); William R. Harshbarger, San Jose, CA (US); Dan Maydan, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 23 days.

(21) Appl. No.: 09/886,174

(22) Filed: Jun. 18, 2001

(65) Prior Publication Data

US 2002/0190651 A1 Dec. 19, 2002

(51) Int. Cl.[7] .................................... C23C 16/40

(52) U.S. Cl. .................... 427/68; 427/579; 427/255.17; 427/255.37

(58) Field of Search .................... 427/68, 579, 255.17, 427/255.37

(56) References Cited

U.S. PATENT DOCUMENTS

| | | | | | |
|---|---|---|---|---|---|
| 4,803,402 | A | | 2/1989 | Raber et al. | 313/509 |
| 5,548,186 | A | | 8/1996 | Ota | 313/583 |
| 5,703,437 | A | | 12/1997 | Komaki | 313/587 |
| 6,054,379 | A | * | 4/2000 | Yau et al. | 438/623 |
| 6,072,227 | A | | 6/2000 | Yau et al. | |
| 6,077,764 | A | | 6/2000 | Sugiarto et al. | 438/597 |
| 6,097,151 | A | | 8/2000 | Kim et al. | 313/586 |
| 6,136,685 | A | | 10/2000 | Narwankar et al. | 438/624 |
| 6,168,726 | B1 | * | 1/2001 | Li et al. | 216/79 |
| 6,287,990 | B1 | | 9/2001 | Cheung et al. | |
| 6,303,519 | B1 | * | 10/2001 | Hsiao | 438/758 |
| 6,303,523 | B2 | | 10/2001 | Cheung et al. | |
| 6,348,725 | B2 | | 2/2002 | Cheung et al. | |
| 6,450,849 | B1 | * | 9/2002 | Harada | 445/24 |
| 6,511,903 | B1 | | 1/2003 | Yau et al. | |

FOREIGN PATENT DOCUMENTS

WO WO 99/41423 8/1999

OTHER PUBLICATIONS

Japanese Application Ser. No. Toku Gan H11–339086, entitled "Formation Method of Dielectric Film by Plasma CVD," filed on Nov. 30, 1999 (translation attached).

* cited by examiner

*Primary Examiner*—Timothy Meeks
(74) *Attorney, Agent, or Firm*—Pennie & Edmonds

(57) ABSTRACT

A plasma display panel including a low k dielectric layer. In one embodiment, the dielectric layer is comprises a fluorine-doped silicon oxide layer such as an SiOF layer. In another embodiment, the dielectric layer comprises a Black Diamond™ layer. In certain embodiments, a capping layer such as SiN or SiON is deposited over the dielectric layer.

37 Claims, 2 Drawing Sheets

PLASMA DISPLAY PANEL WITH A LOW K DIELECTRIC LAYER

FIELD OF THE INVENTION

The present invention relates generally to plasma display panels and more particularly to plasma display panels employing a low k dielectric layer.

BACKGROUND OF THE INVENTION

As is well known, a plasma display panel ("PDP") is a very thin display screen used in large screen displays, for example high definition television displays (HDTV) and the like. PDPs include a pair of dielectric plates, each having a pattern of parallel electrodes thereon. The displays operate by generating a plasma or gas discharge between crossed electrodes inside a partially evacuated environment.

However, one of the limitations of this technology is their high power usage. For example, commercially available PDPs use about 300–700 Watts for the display. Further, the displays require that they be manufactured with a fan integral with the display to help dissipate the large amount of heat generated by their use. One parameter which determines the amount of power used by the PDP and the amount of heat produced therefrom is a dielectric layer that is deposited over the electrodes of the front glass plate. Typically, a lead (Pb) doped glass having a thickness of about 30 microns is used for this dielectric layer. The dielectric constant of this glass layer is generally in the range of about 12 to 16. It is understood that the power consumption and heat generation for the PDPs is a direct function of the dielectric constant of this dielectric layer.

In addition to the onerous power requirements imposed by lead-doped glass, lead is a well-known toxic material and therefor the use of these layers imposes risks upon the workers employed not only in producing the layers, but in assembly of the products down line. Still further, very critical and precise annealing procedures are required in order to get good results from a lead dielectric layer. For example, not only are annealing temperatures of 400–600° C. are said to be required, but a careful, slow and controlled ramping of the temperature of the substrate from room temperature to the anneal temperature is required. The anneal treatment is carried out at the elevated temperature and then a careful, slow and controlled ramp down of the temperature is required to return the substrate to room temperature. Practically speaking, this can require furnaces up to one hundred meters long to carry out the proper annealing of a PDP having a lead dielectric layer.

These PDPs are oftentimes yet further limited by stringent disposal requirements, promulgated because of some of their toxic and environmentally harmful components (e.g., Pb doped films and the like). For example, Japan requires manufacturers to retain cradle-to-grave responsibility for these products.

FIG. 1 illustrates a typical PDP as is commonly known in the art. The PDP is comprised of two glass plates: a front plate 2 and a back plate 4 which are opposite each other. A plurality of transparent parallel electrodes E1 are formed on plate 1 across a plurality of electrodes E2 formed on plate 2, such that the pattern of electrodes on one plate are arranged orthogonally to the pattern of electrodes on the opposite plate. Electrodes E1 may also have a low resistive material, e.g., bus electrodes E3, operably associated with them to lower the electric resistance. A dielectric layer 10 and an MgO layer 12 are formed on the front plate electrodes E1. Commonly, lead-doped glass is used as the dielectric layer. A dielectric layer 11 may optionally be formed on the back plate electrodes E2. A means for fluorescence 8*a*, 8*b* and 8*c* such as phosphors are formed on the back plate electrodes E2. The PDP is constructed in such a manner that the front plate 2 and the back plate 4 are assembled and sealed by a sidewall (not shown) so that a gap is formed between the plates whereby such gap defines a discharge region 6. For maintaining the gap, barrier ribs 7 are formed in the gap between the front panel 2 and the back panel 4, to provide structural support. In this way, a pixel of a unit cell is formed at each intersection between each electrode E1 and each electrode E2. The PDP is capable of displaying an image by a plurality of the pixels driven by a driving circuit.

As described, typically lead (Pb) doped glass is used for this dielectric layer and has a dielectric constant of about 16. It is understood that power consumption and heat generation for PDPs are direct functions of the dielectric constant of this dielectric layer. Accordingly, if a dielectric layer could be used which has a lower dielectric constant, yet is the same as or better than previous dielectric layers in respect to other relevant attributes, the power consumption and heat generation could be decreased. It would be further beneficial if such a dielectric layer could be manufactured without toxic and environmentally unfriendly materials such as lead. Thus, there is a need for a PDP with a dielectric layer which has a low dielectric constant, high transmittance, high electrical breakdown voltage and good stability, which would decrease the power consumption and heat generation of the display while maintaining the required luminosity characteristics.

The present invention endeavors to address and solve these and other problems associated with PDPs.

SUMMARY OF THE INVENTION

Plasma display panels are disclosed which include a first plate having a first set of parallel electrodes deposited thereon, a second plate having a second set of parallel electrodes deposited thereon, and at least one of the sets of electrodes being covered by a low k dielectric layer.

The second set of parallel electrodes are oriented at right angles to the first set of parallel electrodes. The first and second plates are oriented parallel to one another to form a space therebetween filled with a discharge gas.

The low k dielectric material used to deposit the low k dielectric layer may be a halogen doped silicon oxide layer, such as a fluorine doped silicon oxide layer, e.g. SiOF. The layer typically has a thickness of about 10 to 15 microns.

A dielectric layer may also be formed from trimethylsilanes and/or methysilanes. For example, a dielectric layer comprising Black Diamond™ may be formed. Such a layer typically has a thickness of about 10 to 15 microns.

Optionally, a capping layer may be deposited over the low k dielectric layer. The capping layer may be formed from a silicon source and nitrogen source, and may comprise SiN or SiON, for example. A capping layer according to the present invention typically has a thickness of about 10 to 100 nanometers.

A method of making a plasma display panel is disclosed to include flowing a process gas in a processing chamber over a glass substrate having parallel electrodes; applying RF energy to the chamber to create a plasma; and depositing a low k dielectric layer on said glass substrate, wherein said dielectric layer has a low k value.

The process gas may comprise a fluorine source, a silicon source, an oxygen source and/or a nitrogen source. Optionally, a carrier gas may also be flowed with the process gas.

Further optionally, a method of depositing a capping layer over the dielectric layer is disclosed to include flowing a capping layer process gas; applying RF energy to the chamber to create a plasma; and depositing a capping layer over said dielectric layer.

The capping layer process gas may comprise a silicon source and a nitrogen source. The capping process gas may further comprise an oxygen source.

These and other objects, advantages, and features of the invention will become apparent to those persons skilled in the art upon reading the details of the PDPs and methods as more fully described below.

DETAILED DESCRIPTION OF THE INVENTION

Figure 1:
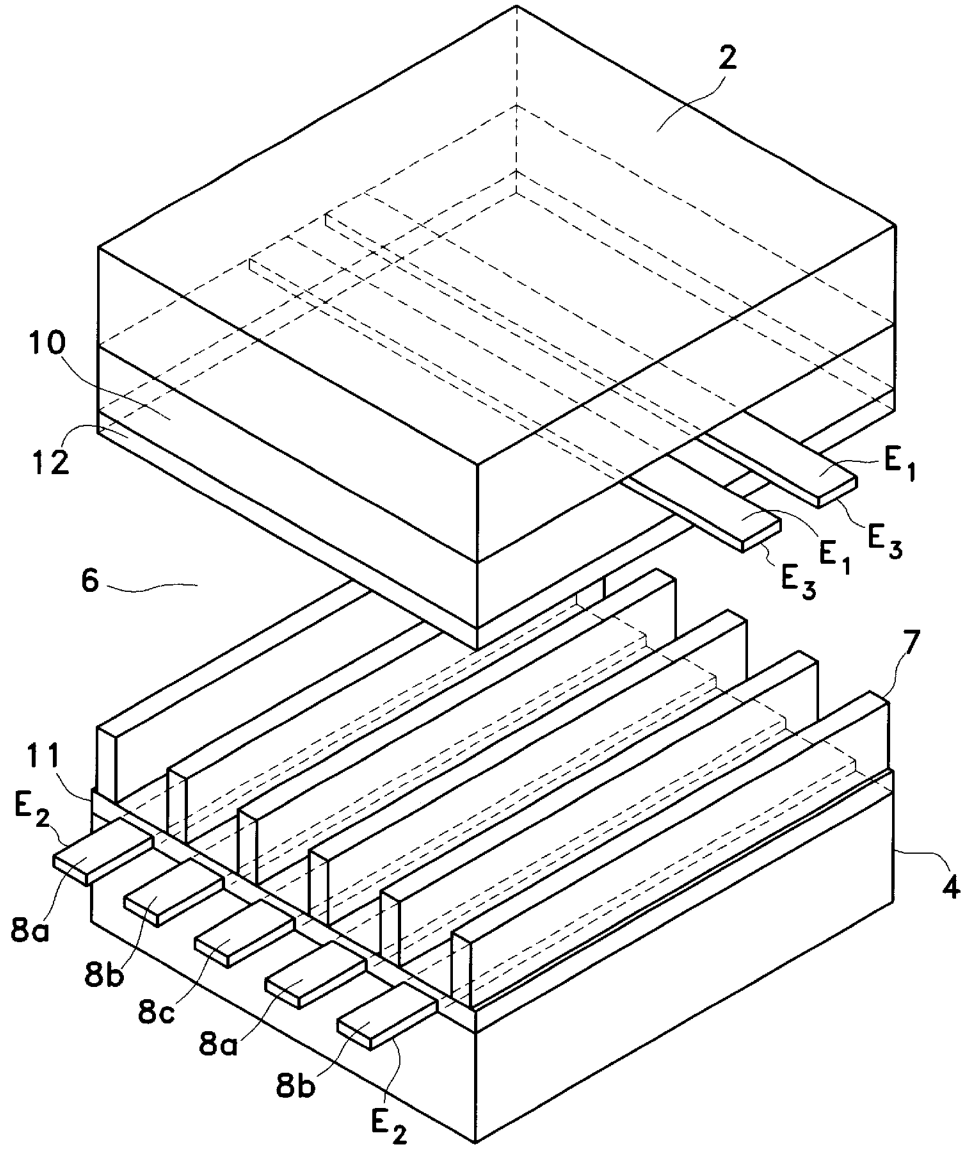
Fig. 1 (PRIOR ART)
FIG. 1 is a cross-sectional view of a PDP known in the art.

Before the present embodiments are described, it is to be understood that this invention is not limited to particular materials, substrates, etc. described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value and intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "and", and "the" include plural referents unless the context clearly dictates otherwise. Thus, for example, reference to "a substrate" includes a plurality of such substrates and reference to "the metal" includes reference to one or more metals and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

"Dielectric" as used herein refers to a material in which an electric field can be maintained with zero or near zero power dissipation, i.e., the electrical conductivity is zero or near zero.

"Low k" and "Low k Material" as used herein refers to dielectric material having a dielectric constant (i.e., "k") value significantly less than 16. The exemplary embodiments have k values less than about 4.5.

Plasma Display Panel

The present invention is directed towards a plasma display panel ("PDP") comprising a low k dielectric layer. In certain embodiments, a capping layer is deposited over the dielectric layer. In further describing the invention, the subject PDP, exemplary embodiments of the PDP and methods to produce the PDP are described.

Exemplary Embodiments of the Subject Invention

An embodiment of a PDP according to the present invention will be described hereinbelow with reference to FIG. 2.

Figure 2:
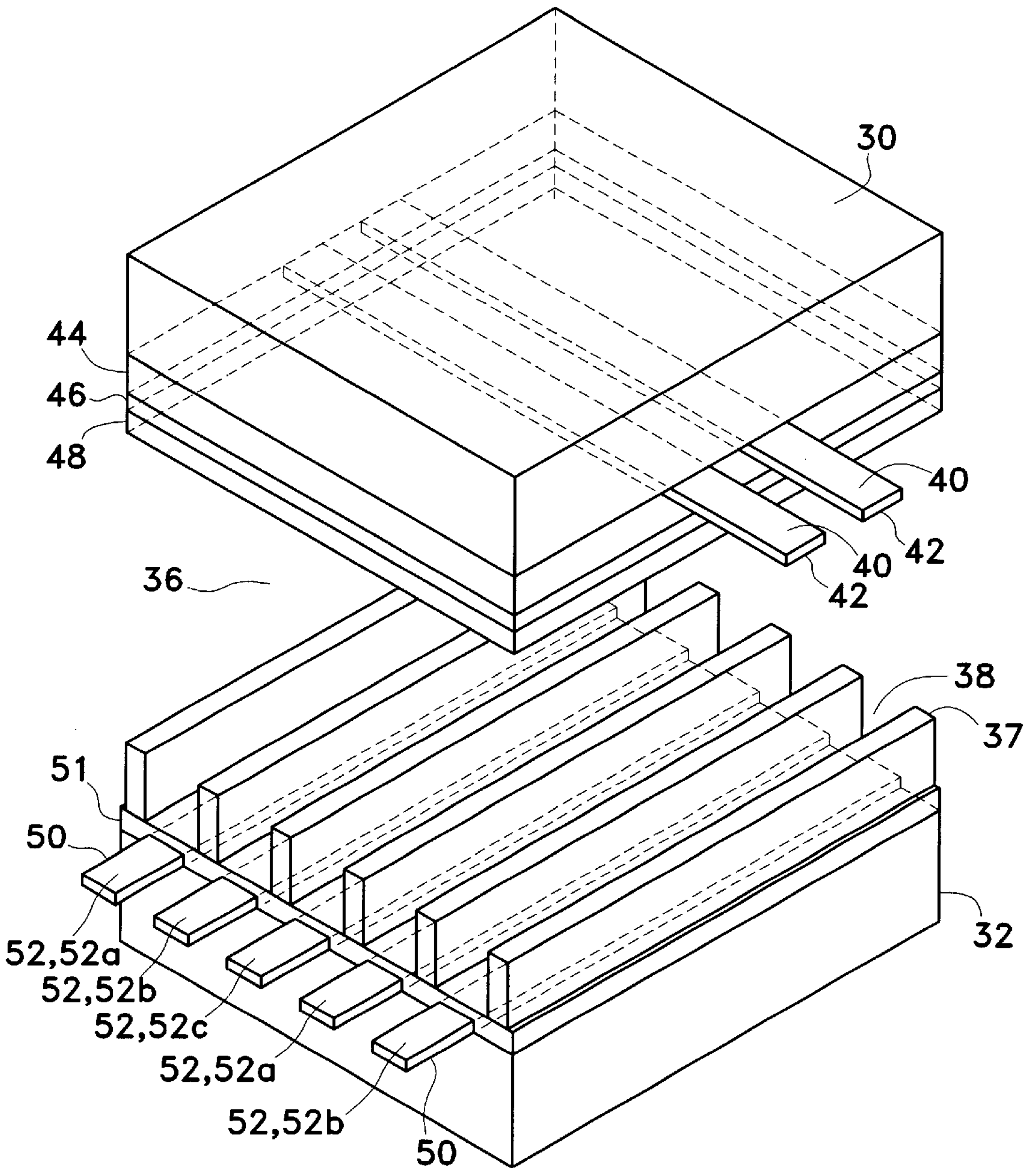
FIG. 2 is a cross sectional view of a PDP according to the present invention.

FIG. 2 is a cross-sectional illustration of a PDP according to the present invention. The PDP includes a front side transparent substrate 30 of glass as a display surface and a back side glass substrate 32 disposed in parallel to the front side substrate whereby the front substrate 30 and the back substrate 32 are assembled and sealed together by a sidewall (not shown) to form a gap 36 therebetween. Barrier ribs 37 are formed in the gap 36 between the substrates 30 and 32 to structurally support the substrates and maintain the gap. The front side substrate 30, the back side substrate 32 and a pair of barrier ribs define and surround a space as a discharge region 38.

The front side substrate 30 has a plurality of pairs of transparent electrodes 40 and 40 as column electrodes on its surface facing the back side substrate 32 in such a manner that the column electrodes extend parallel to each other. The pairs of column electrodes serve as control electrodes for driving the pixels and are formed of a transparent conductive material, such as indium tin oxide. Electrodes 40 and 40 may also have a low resistive material, e.g., bus electrodes 42, operably associated with them to lower the electric resistance. Bus electrodes 42 and 42 are formed on and along the far opposite edges of the transparent electrodes 40 and 40, respectively to the edges thereof. The bus electrodes 42 and 42 are made of copper, for example, and each has a width narrower than that of the column electrode 40. A dielectric layer 44 is formed on the pairs of column electrodes 40 and 40 and the bus electrodes 42 and 42 as covering them at a thickness of about 10 to 15 microns. A capping layer 46 may be formed on the dielectric layer 44 at a thickness of about 10 to 100 nanometers. A layer 48 comprised of magnesium oxide (MgO), for example, is formed on the capping layer 46 at a thickness of about 0.5 microns.

The dielectric layer 44 is a low k dielectric layer. In exemplary embodiments, the dielectric layer is comprised of a halogen-doped silicon oxide layer having a dielectric constant of 4.5 or less, e.g., a fluorine-doped silicon oxide layer (SiOF) having a dielectric constant of about 3.0 to 4.5. Consequently, such a PDP will require only about 100 to 250 Watts of power during use, compared to a prior art PDP of the same size which would require about 300 to 700 Watts to operate.

Accordingly, a silicon oxide film is deposited over the column electrodes by first introducing a process gas into a processing chamber and then applying an RF power component to the process gas to form a plasma. The SiOF layer may be deposited in any suitable PECVD chamber such as those manufactured by AKT, Inc. and/or Applied Materials, e.g., AKT 5500, 1600, 3500 and 4300 PECVD Systems. It will be appreciated that other suitable processing chambers can be used with the present invention as well.

SiOF is deposited using a process gas comprising fluorine, oxygen, nitrogen and silicon precursors. As such, fluorine sources suitable for use in the present invention include $CF_4$, $C_2F_6$ and $NF_3$ and the like. In one particular method of depositing the layer, the process gas includes silicon tetrafluoride ($SiF_4$) as the fluorine source and forms a plasma therefrom. It is believed that $SiF_4$ is a particularly effective fluorine source for SiOF layers because the four fluorine atoms bonded to a silicon atom in a molecule of the gas supply a higher percentage of fluorine into the deposition chamber for a given flow rate as compared with other fluorine sources. Additionally, $SiF_4$ has more fluorine bonded to silicon available for the plasma reaction than other fluorine sources. However, it will be appreciated that any other appropriate fluorine source could be employed in the present invention as well.

As described above, the process gas also includes a gaseous source of silicon. In one exemplary embodiment, silicon is provided by silane ($SiH_4$). Further, an oxygen precursor is also included in the process gas, for example a gaseous source of oxygen such as $O_2$, $N_2O$, $CO_2$, or a mixture of two or more of the same. An inert gas such as a gaseous source of helium (He), argon (Ar) or the like may optionally be flowed along with the precursor gases.

To form the halogen-doped silicon oxide dielectric layer, e.g., a fluorine-doped silicon oxide layer, of the present invention, the PDP substrate, i.e., a glass substrate comprised of at least one electrode is loaded into a processing chamber through a vacuum interlock and placed onto a pedestal in the chamber.

Once the substrate is properly positioned, the substrate is heated by the plasma and initially by the pedestal (e.g., by one or more heating elements such as resistive coils or by other methods) to a temperature of about 300° C. to 450° C. and a process gas is introduced into the processing chamber from a gas distribution manifold. In one example, the process gas is a mixture comprising $SiF_4$ as the gaseous source of fluorine and silicon; and $O_2$, $N_2O$ or $CO_2$ as the gaseous source of oxygen. As one alternative, $SiH_4$ may be used as the gaseous source of silicon, $CF_4$ may be used as a gaseous source of fluorine, and $O_2$, $N_2O$ or $CO_2$ (or mixtures thereof) may be used as the gaseous source of oxygen.

In an example where $SiF_4$ is used, $SiF_4$ will be introduced into the processing chamber at a flow rate of about 500 to 2000 sccm, and $O_2$, $N_2O$, $CO_2$ or a mixture of two or more of these will be introduced at a flow rate of about 5000 to 30,000 sccm. These gas flow rates are given for a chamber having a volume of about 48 liters adapted to accommodate an A4 PDP substrate with dimensions of about 21 cm×30 cm. Those skilled in the art will recognize that the gas flow rates, as well as other processing parameters, will vary with variations in chamber and substrate size and can be adjusted accordingly. Generally, the gas flow rates are set such that a ratio of the sum of the flow rates of the gaseous sources of oxygen divided by the flow rates of $SiF_4$ is about 5 to 20. Specific flow rates will depend upon the substrate size (the surface of which the film is to be deposited on) and the desired deposition rate.

The chamber will be maintained at a pressure of about 1–15 Torr and the process gas will be excited into a plasma state through the use of an RF power source at a power density of about 0.75 to 3.0 W/cm$^2$. The deposition rate of the process is estimated to be about 1 $\mu$/minute. Typically, the gases will flow for about 10 minutes, but the time, of course, is dependent upon the desired final thickness of the film being deposited. After deposition of the layer, the RF power is turned off, the gas flow into the chamber is stopped and the gases in the chamber are pumped out of the chamber. The result is a stable SiOF layer of uniform thickness having a fluorine content of about 1–30% (atomic percent) and having a dielectric constant of about 3.0 to 4.5, and usually between about 3.2 and 4.0.

In another example, $SiH_4$ is introduced into the processing chamber at a flow rate of about 500 to 2000 sccm, $CF_4$ is typically introduced at a flow rate of about 1000 to 3000 sccm, and $N_2O$ or $CO_2$ is introduced at a flow rate of about 5000 to 30,000 sccm. These gas flow rates are given for a chamber having a volume of about 48 liters adapted to accommodate an A4 PDP substrate with dimensions of about 21 cm×30 cm. Those skilled in the art will recognize that the gas flow rates, as well as other processing parameters, will vary with variations in chamber and substrate size and can be adjusted accordingly. Generally, the gas flow rates are set such that a ratio of the sum of the flow rates of the gaseous sources of oxygen divided by the sum of the flow rates of $SiH_4$ and $CF_4$ is about 5 to 20. Specific flow rates will depend upon the substrate size (the surface of which the film is to be deposited on) and the desired deposition rate.

The chamber is maintained at a pressure of about 1–15 Torr and the process gas is excited into a plasma state through the use of an RF power source at a power density of about 0.75 to 3.0 W/cm$^2$. The deposition rate of the process is at about 1 $\mu$/minute. Typically, the gases flow for about 10 minutes, but, as noted above, time durations will vary according to the thickness requirements of the deposition layer. After deposition of the layer, the RF power is turned off, the gas flow into the chamber is stopped and the gases in the chamber are pumped out of the chamber. The result is a stable SiOF layer of uniform thickness having a fluorine content of about 1–30% (atomic percent) and having a dielectric constant of about 3.0 to 4.5, and usually between about 3.2 and 4.0.

One problem encountered in the deposition of SiOF layers is the stability of the layer. Loosely bound fluorine atoms in the lattice structure of some SiOF layers results in films having a tendency to absorb moisture. The absorbed moisture increases the film's dielectric constant and can cause other problems as well, for example if the substrate is exposed to a thermal process such as an anneal process. The high temperatures of thermal processes can move the absorbed water molecules and loosely bound fluorine atoms out of the layer through other subsequently deposited layers. The excursion of molecules and atoms in this manner is referred to as outgassing. To reduce or substantially eliminate moisture absorption and outgassing, a capping layer 46 may be deposited over the dielectric layer 44.

Typically, the capping layer will be deposited in situ with the dielectric layer. Two capping layers particularly suitable for capping dielectric layers, e.g., halogen doped silicon oxide layers such as SiOF, are SiON and SiN layers; however, it will be appreciated that other appropriate capping layers can be used with the present invention as well.

In one exemplary embodiment, SiON is the capping layer. Accordingly, a capping layer process gas comprised of a gaseous source of silicon ($SiH_4$), and a gaseous source of oxygen ($O_2$, $N_2O$ or $CO_2$) is first introduced into a chamber and then an RF power component is applied to the processing gas to form a plasma.

For example, the substrate is heated by the pedestal (pedestal temperature is about 300–450° C.). $SiH_4$ is flowed into the chamber at about 400–700 sccm, $N_2$ is flowed into the chamber at about 15,000–20,000 sccm and $N_2O$ is flowed into the chamber at about 1500 to 3000 sccm. It is noted that a carrier gas such as an inert gas, e.g., helium (He), argon (Ar), or the like can be flowed into the processing chamber as well. Those skilled in the art will recognize that the gases can be flowed sequentially or simultaneously. The chamber pressure is maintained at about 1.0 to 5.0 Torr and the process gas is excited into a plasma state through the use of an RF power source at a power density of about 1.0 to 3.0 W/cm$^2$. Deposition occurs at a rate of about 0.25 $\mu$/minute. After deposition of the layer, the RF power is turned off, the gas flow into the chamber is stopped and the gases in the chamber are pumped out of the chamber. It will be appreciated that the processing parameters can be modified or changed in response to variations in chamber and/or substrate size variations.

The result is a capping layer, i.e., an SiON capping layer, with a thickness of about 10 to 100 nanometers suitable to minimize or substantially eliminate moisture absorption and outgassing of the underlying layer.

In another embodiment, the capping layer is an SiN layer deposited over the dielectric layer. As such, a capping layer process gas comprised of a gaseous source of silicon ($SiH_4$) and a gaseous source of nitrogen ($N_2$, $NH_3$) is first introduced into a chamber and an RF power component is applied to the processing gas to form a plasma.

For such an SiN capping layer, the substrate is heated by the pedestal (pedestal temperature is about 300–450° C.), $SiH_4$ is flowed into the chamber at about 400 to 700 sccm, $N_2$ is flowed into the chamber at about 15,000 to 20,000 sccm and $NH_3$ is flowed into the chamber at about 2,500 to 5,000 sccm. It is noted that a carrier gas such as an inert gas, e.g., helium (He), argon (Ar), or the like and can be flowed into the processing chamber as well. Those skilled in the art recognize that the gases can be flowed sequentially or simultaneously, and that flow rates will vary depending upon the substrate size and the desired deposition rate. Generally, the gas flow rates are set such that a flow ratio defined by the sum of the flow rates of the gaseous sources of nitrogen divided by the flow rate of $SiH_4$ is about 25 to 60. Specific flow rates will depend upon the substrate size (the surface of which the layer is to be deposited on) and the desired deposition rate.

The chamber pressure is maintained at about 1.0 to 5.0 Torr and the process gas is excited into a plasma state through the use of an RF power source at a power density of about 1.0 to 3.0 W/cm$^2$. Deposition occurs at a rate of about 0.25 $\mu$/minute for a flow ratio of about 36 and a substrate size of about 21 cm×30 cm. The deposition rate of SiON is determined by the $SiH_4$ flow rate. After deposition of the layer, the RF power is turned off, the gas flow into the chamber is stopped and the gases in the chamber are pumped out of the chamber. It will be appreciated that the processing parameters can be modified or changed in response to chamber and/or substrate size.

The result is a capping layer, i.e., a SiN layer, with a thickness of about 10 to 100 nanometers sutitable to minimize or substantially eliminate moisture absorption and outgassing of the underlying layer.

In other preferred embodiments of the present invention, the dielectric layer is comprised of either methylsilane (MS) or trimethylsilane (TMS) and an oxygen source, e.g., a Black Diamond™ layer is particularly suitable for use in the present invention, (i.e., a composition comprising TMS/$O_2$, TMS/$O_3$, TMS/$NO_2$, or MS/$N_2O$ (supplied by Airproduct, Allentown, Pa.)), which has a dielectric constant of less than about 3.5, and usually between about 2.6 and 3.4.

In one example, a Black Diamond™ layer is deposited over the electrodes by first introducing a process gas into a chamber and then applying an RF power component to the process gas to form a plasma. The Black Diamond™ layer may be deposited in any suitable PECVD chamber such as those manufactured by AKT, Inc. and/or Applied Materials, e.g., an AKT 5500, 1600, 3500 and 4300. It will be appreciated that other suitable processing chambers can be used as well.

Either TMS or MS or a combination of these precursors may be flowed with an oxygen precursor to form a plasma. In many embodiments, an inert gas such as a gaseous source of helium (He), argon (Ar) or the like is also flowed along with the precursor gases. Accordingly, to form the Black Diamond™ dielectric layer of the present invention, the PDP substrate, i.e., a glass substrate with at least one electrode, is loaded into a processing chamber through a vacuum interlock and placed onto a pedestal in the chamber. Once the substrate is properly positioned, the temperature of the substrate and chamber are controlled so as to maintain a processing temperature of about 0° C. to about 250° C., for example. The process gas is then introduced into the processing chamber from a gas distribution manifold. The process gas is a mixture comprising TMS or MS or a combination thereof and a gaseous source of oxygen (such as $O_2$, $O_3$, $N_2O$ or some combination thereof); preferably the process gas is TMS and $O_2$, TMS and $O_3$, TMS and $N_2O$ or MS and $N_2O$.

TMS or MS or a combination of TMS and MS is introduced into the processing chamber at a flow rate of about 30–150 sccm and either $O_2$, $O_3$, $N_2O$ or some combination thereof is introduced at a flow rate of about 300–1500 sccm. Those skilled in the art recognize that the gases can be flowed sequentially or simultaneously and that the flow rates scale with the size of the chamber being used and the surface area of the substrate upon which the film is to be deposited. In addition, helium (He) may be may be introduced as a carrier gas. If used, He will be introduced into the processing chamber at a rate of about 1500–8000 sccm. Generally, the gas flow rates are set such that a ratio of the sum of the flow rates of the gaseous sources of oxygen divided by the sum of the flow rates of TMS and MS will be about 2 to 50, usually about 5 to 40. If used, the ratio of He flow to the sum of the flow rates of TMS and MS will be about 10 to 260, usually about 30 to 75.

The chamber is maintained at a pressure of about 1–15 Torr and the process gas is excited into a plasma state through the use of an RF power source which generates a power density of about 0.10 to 0.25 W/cm$^2$. The deposition rate of the process will be at least about 350 nanometers per minute, for a flow ratio, defined by the flow rate of gaseous sources of oxygen divided by the sum of the flow rates of TMS and MS of about 10. The duration of the flow of gases will be determined by the desired thickness of the layer to be deposited. After deposition of the layer, the RF power is turned off, the gas flow into the chamber is stopped and the gases in the chamber are pumped out of the chamber. The result of this process is a stable Black Diamond™ layer having a thickness of about 10 to 15 microns having a dielectric constant of less than about 3.5, and usually between about 2.6 to 3.4. It is understood that the processing gases can be flowed concurrently or serially. It is noted that a capping layer may be omitted for a Black Diamond™ dielectric layer.

In one example, using an AKT 1600 PECVD chamber to deposit a Black Diamond™ dielectric layer on a substrate having a length of about 47 cm and a width of about 37 cm, the chamber will be maintained at a temperature of about 25° C. after loading the substrate. Methylsilane will then be flowed into the chamber at about 117 sccm and $N_2O$ will be flowed in at about 1,235 sccm. Additionally, helium will be flowed in at about 6,800 sccm. The pressure in the chamber will be controlled to about 3 Torr during processing, and an RF power of about 275 W will be used to generate the plasma for forming the Black Diamond™ deposition layer. The deposition rate will be about 350 nanometers/minute and processing will proceed for about 25 to 45 minutes to form a deposition layer of about 10 to 15 microns in thickness.

Referring again to FIG. 2, the back side substrate 32 has a plurality of addressing electrodes 50 as row electrodes on its surface facing the front side substrate 30 in such a manner that the row electrodes extend in parallel to each other. The row electrodes 50 also serve as sustaining electrodes for driving the pixels and are formed of a high reflectance material, for example a metal such as Cu, Al, an Al alloy or any other appropriate metal or alloy thereof having a high reflectance such as copper alloys, Au or an alloy thereof, although copper is used most often. A dielectric layer 51 may optionally be formed on the addressing electrodes 50.

The barrier ribs (not shown) are formed between the row electrodes 50 on the back side substrate 32 to define and surround spaces such as discharge regions. The row electrodes 50 and the exposed surface of the back side substrate 32 are covered with a fluorescent layer 52 for a monochrome PDP. In the case of a color PDP, three fluorescent layers made of fluorescent substances for emitting red 52*a,* blue 52*b* and green 52*c* lights are formed in turn on the corresponding row electrodes 50 respectively, so that each pixel emits light correspondingly to the fluorescent substance.

The back side substrate 32 and the front side substrate 30 are assembled in such a manner that the row electrodes 50 are perpendicular to the column electrodes 40. After assembly, the intersections with a gap between the column electrodes 40 and the row electrodes 50 define discharge regions 38 for emitting regions of pixels. The front side substrate and the back side substrate are fixed to each other and the gap of discharge regions 38 is exhausted by a vacuum pump. Subsequently, the assembly is baked so that the surface of the MgO layer 48 is activated. Next, an inert gas mixture including a rare gas of xenon (Xe) (e.g., Xe, He and Kr) is introduced and sealed into the discharge regions.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process step or steps, to the object, spirit and scope of the present invention. All such modifications are intended to be within the scope of the claims appended hereto.

That which is claimed is:

1. A method of making a plasma display panel, said method comprising the steps of:

flowing a process gas in a processing chamber over a plasma display panel substrate;

creating a plasma of said process gas; and depositing a low k dielectric layer on said plasma display panel substrate, wherein said dielectric layer has a low k value, wherein said flowing a process gas comprises:

(i) flowing at least one halogen source, at least one silicon source, and at least one oxygen source or (ii) flowing at least one silicon source selected from the group consisting of a trimethylsilane and a methylsilane; and flowing at least one oxygen source.

2. The method of claim 1, wherein said flowing a process gas comprises flowing said at least one halogen source, said at least one silicon source, and said at least one oxygen source and wherein said at least one halogen source is selected from the group consisting of $SiF_4$, $CF_4$, $C_2F_6$ and $NF_3$.

3. The method of claim 1 wherein said flowing a process gas comprises flowing said at least one halogen source, said at least one silicon source, and said at least one oxygen source and wherein a ratio of said at least one oxygen source to a sum of the flow rate of said at least one halogen source and the flow rate of said at least one silicon source is about 5 to 20.

4. The method of claim 1, wherein said flowing a process gas comprises flowing said at least one halogen source, said at least one silicon source, and said at least one oxygen source and wherein said at least one oxygen source is selected from the group consisting of $O_2$, $N_2O$ and $CO_2$.

5. The method of claim 1, wherein said flowing a process gas comprises flowing said at least one halogen source, said at least one silicon source, and said at least one oxygen source and wherein a flow rate of said at least one oxygen source is about 7.5 slm to about 200 slm.

6. The method of claim 1, wherein said flowing a process gas comprises flowing at least one halogen source, at least one silicon source, and at least one oxygen source and wherein said at least one silicon source and said at least one halogen source is $SiF_4$.

7. The method of claim 6, wherein a ratio of a flow rate of said at least one oxygen source to a flow rate of said at least one silicon source is about 5 to 20.

8. The method of claim 1 wherein said flowing a process gas comprises flowing said at least one halogen source, said at least one silicon source, and said at least one oxygen source and wherein said process gas is flowed for about 3 to 10 minutes while the pressure in said processing chamber is about 1 Torr to about 15 Torr and the temperature of said plasma display panel substrate is about 300° C. to about 450° C.

9. The method of claim 1, wherein said flowing a process gas comprises flowing said at least one halogen source, said at least one silicon source, and said at least one oxygen source and wherein said creating comprises applying an RF energy to the chamber at a power density of about 0.75 $W/cm^2$ to 3.0 $W/cm^2$.

10. The method of claim 1, wherein said flowing a process gas comprises owing at least one silicon source selected from the group consisting of a trimethylsilane and a methylsilane; and flowing at least one oxygen source and wherein a ratio of a flow rate of said at least one oxygen source to a flow rate of said at least one silicon source is about 2 to 50.

11. The method of claim 1, wherein said flowing a process gas comprises flowing at least one silicon source selected from the group consisting of a trimethylsilane and a methylsilane; and flowing at least one oxygen source and wherein said at least one oxygen source is selected from the group consisting of $O_2$, $CO_2$, $O_3$ and $N_2O$.

12. The method of claim 1, wherein said flowing a process gas comprises flowing at least one silicon source selected from the group consisting of a trimethylsilane and a methylsilane; and flowing at least one oxygen source and wherein said process gas further comprises a carrier gas.

13. The method of claim 1, said flowing a process gas comprises flowing said at least one halogen source, said at least one silicon source, and said at least one oxygen source, the method further comprising the steps of flowing a capping layer process gas;

creating a second plasma; and depositing a capping layer over said dielectric layer.

14. The method of claim 13, wherein said capping layer process gas comprises at least one silicon source and at least one nitrogen source.

15. The method of claim 14, wherein said at least one silicon source comprises $SiH_4$.

16. The method of claim 14, a ratio of a flow rate of said at least one nitrogen source to a flow rate of said at least one silicon source is about 25 to 60.

17. The method of claim 14, wherein said at least one nitrogen source is selected from the group consisting of $N_2$ and $NH_3$.

18. The method of claim 14, wherein said capping process gas further comprises at least one oxygen source.

19. The method of claim 18, wherein said at least one oxygen source is selected from the group consisting of $O_2$, $N_2O$ and $CO_2$.

20. The method of claim 18, wherein creating a second plasma comprises applying an RF energy to said chamber at a power density of about 1.0 W/cm$^2$ to 3.0 W/cm$^2$.

21. The method of claim 13, wherein said capping layer process gas is flowed for about 0.2 to 2 minutes while the pressure in said processing chamber is about 1.0 to 3.0 Torr and the temperature of said plasma display panel substrate is about 300° C. to 450° C.

22. The method of claim 13, wherein said creating a second plasma comprises applying an RF energy to the chamber at a power density of about 1.0 W/cm$^2$ to 3.0 W/cm$^2$.

23. The method of claim 13, wherein said capping layer process gas is flowed for about 0.2 to 2.0 minutes while the pressure in said processing chamber is about 1.0 to 5.0 Torr and the temperature of said plasma display panel substrate is about 300° C. to 450° C.

24. The method of claim 1 wherein said chamber is a plasma enhanced chemical vapor deposition chamber.

25. The method of claim 1 wherein said plasma display panel substrate is a glass that includes at least one electrode.

26. The method of claim 1 wherein said glass has dimensions of about 21 centimeters by 30 centimeters.

27. The method of claim 1 wherein said depositing a low k dielectric layer on said plasma display panel substrate occurs at a deposition rate of about 1 micron per minute.

28. The method of claim 1 wherein said low k dielectric layer has a dielectric constant of about 3.0 to 4.5.

29. The method of claim 1 wherein said low k dielectric layer has a dielectric constant of less than about 3.5.

30. The method of claim 1 wherein said glass has dimensions of about 47 centimeters by about 37 centimeters.

31. A method of making a plasma display panel, said method comprising the steps of flowing a process gas in a processing chamber over a plasma display panel substrate;

creating a plasma of said process gas; and depositing a low k dielectric layer on said plasma display panel substrate, wherein said dielectric layer is a carbon-doped dielectric comprising hydrogen, carbon, silicon, and oxygen, an atomic percentage of said carbon being between 5 and 25% and an atomic percentage of said silicon being between 15 and 25%, and an atomic percentage of said hydrogen being between 35 and 60%.

32. The method of claim 31 wherein said plasma display panel substrate is maintained at a processing temperature of about 0° C. to about 250° C. during said depositing.

33. The method of claim 31 wherein said processing chamber is maintained at a pressure of 1–15 Torr during said depositing.

34. A The method of claim said creating a plasma comprises using an RF power source that generates a power density of between 0.10 W/cm$^2$ and 0.25 W/cm$^2$.

35. The method of claim 31 wherein said dielectric layer has a thickness of between 10 microns and 15 microns.

36. The method of claim 31 said dielectric layer has a dielectric constant of less than about 3.5.

37. The method of claim 31 said dielectric layer has a dielectric constant between about 2.6 and 3.4.

* * * * *